US007081669B2

(12) United States Patent
Fitzgerald et al.

(10) Patent No.: US 7,081,669 B2
(45) Date of Patent: Jul. 25, 2006

(54) DEVICE AND SYSTEM FOR HEAT SPREADER WITH CONTROLLED THERMAL EXPANSION

(75) Inventors: Thomas J. Fitzgerald, Phoenix, AZ (US); Carl Deppisch, Chandler, AZ (US); Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 10/726,558

(22) Filed: Dec. 4, 2003

(65) Prior Publication Data

US 2005/0121775 A1 Jun. 9, 2005

(51) Int. Cl.
*H01L 23/10* (2006.01)
*H01L 23/34* (2006.01)

(52) U.S. Cl. ........................................ 257/707; 257/706

(58) Field of Classification Search ................. 257/706, 257/707

See application file for complete search history.

(56) References Cited

U.S. PATENT DOCUMENTS

| | | | | |
|---|---|---|---|---|
| 5,644,163 | A * | 7/1997 | Tsuji | 257/706 |
| 5,728,309 | A * | 3/1998 | Matsen et al. | 219/633 |
| 5,829,716 | A * | 11/1998 | Kirkwood et al. | 244/117 R |
| 2001/0015492 | A1 * | 8/2001 | Akram et al. | 257/706 |
| 2004/0084763 | A1 * | 5/2004 | Yang | 257/706 |

* cited by examiner

*Primary Examiner*—Ngân V. Ngô
(74) *Attorney, Agent, or Firm*—Pearl Cohen Zedek Latzer, LLP

(57) ABSTRACT

Devices and systems including a heat spreader with possibly controlled thermal expansion. For example, an integral heat spreader may include an insert formed of a high thermal conductivity material with a first coefficient of thermal expansion, and a ring formed of a stiff material with a second coefficient of thermal expansion, wherein the second coefficient of thermal expansion is smaller or significantly smaller than the first coefficient of thermal expansion. An integral heat spreader may optionally include, for example, a plating, a coating, or a patch, and may be included, for example, in a semiconductor device.

32 Claims, 4 Drawing Sheets

300
101
303
102
102
307
307
305
304
306

DEVICE AND SYSTEM FOR HEAT SPREADER WITH CONTROLLED THERMAL EXPANSION

BACKGROUND OF THE INVENTION

An Integral Heat Spreader (IHS) may be used, for example, as a component of semiconductor packaging, e.g., packaging of a processor, a "chip", a controller, a memory unit, or another suitable device. An IHS may be formed, for example, of a single metal which may have high thermal conductivity (e.g., copper), and may be placed in proximity to a silicon die. The IHS may have a relatively high Coefficient of Thermal Expansion (CTE), for example, a CTE value of $15.5*10^{-6}$/°C. for a copper IHS. The silicon die may have a relatively low CTE, for example, a CTE value of $2.6*10^{-6}$/°C. Of course, other CTE values may be used.

The relatively high difference between the CTE value of the silicon die and other package components (e.g., a substrate) and the CTE value of the IHS may cause the assembled package may warp when the chip is powered up, or when the chip is thermally cycled (e.g., in an oven during the manufacturing process of the chip). The warping may result in various problems, failures, and reliability issues, for example, delamination of an adjacent Polymer Thermal Interface Material (PTIM), cracking of an adjacent Solder Thermal Interface Material (STIM), or other failures of the chip package. Furthermore, the warping may aggravate cracking of dielectric layers on the silicon die, and may even lead to the silicon die being torn apart.

To partially mitigate some of the above problems, a suitable Thermal Interface Material (TIM) layer may be used, for example, between an IHS and a silicon die. However, the TIM layer may be thick or relatively thick; this may result in, for example, a thick or a relatively thick package, and/or may lead to high or relatively high thermal resistance at the TIM layer. Additionally, the TIM may not adequately or completely solve all the above problems, failures and reliability issues.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanied drawings in which:

Figure 1A:
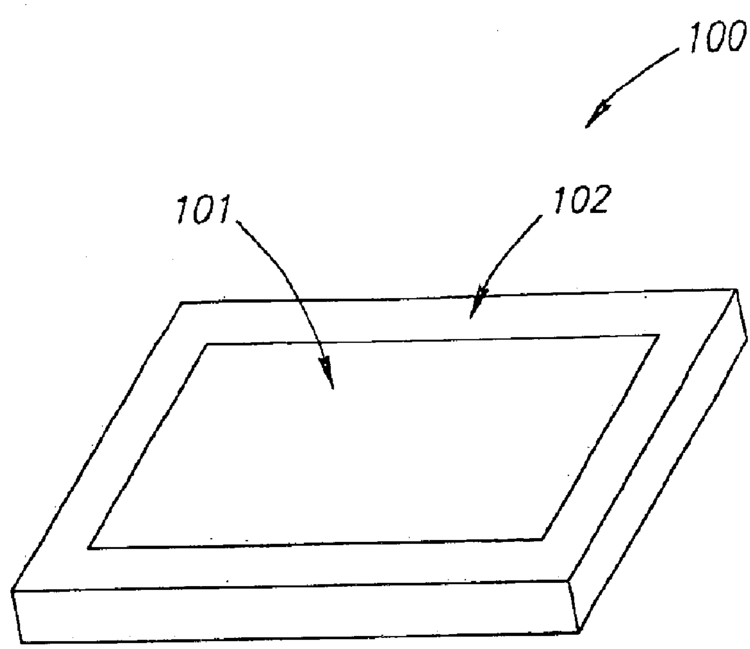
FIG. 1A is a schematic illustration of a top view of an IHS in accordance with an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, units and/or circuits have not been described in detail so as not to obscure the invention.

Some embodiments of the invention include an IHS with improved and/or possibly controlled thermal expansion. An IHS in accordance with some embodiments of the invention may include, for example, an insert embedded in a relatively stiff constraining ring or surrounding body. In some embodiments, the insert may be formed of, or may include, substantially a material which has a relatively high thermal conductivity (e.g., copper, aluminum, or silver). In some embodiments, the ring may be formed substantially of a material which has a relatively low CTE value (e.g., tungsten, stainless steel, a suitable nickel iron (Ni—Fe) alloy (such as, for example, invar), carbon fibers, etc.). Optionally, in some embodiments, the ring may be formed of a material which has a relatively high elastic modulus, or a relatively high modulus of elasticity, and a high yield stress. Optionally, in some embodiments, the insert may be, for example, taper-shaped or wedge-shaped, to allow the insert to expand and/or defect as temperature rises, and to allow the insert to compress an adjacent TIM or other layer.

FIG. 1A is a schematic illustration of a top view of an IHS in accordance with an embodiment of the invention. IHS 100 may include, for example, an insert 101 and a ring or surrounding body 102. Other suitable components may be included in IHS 100.

Insert 101 may be formed of, or may include, a metal with high thermal conductivity, for example, substantially copper, substantially aluminum, or substantially silver. In one embodiment, for example, insert 101 may be formed of, or may include, a suitable copper alloy or a suitable composite material containing copper. In some embodiments, for example, insert 101 may be formed of, or may include, between 30 percent and 100 percent copper, or between 30 percent and 100 percent aluminum, or between 30 percent and 100 percent silver. Other suitable metals, alloys and/or materials may be used, as well as other percentage values. Insert 101 may be formed of, or may include, for example, a metal that may have a high or a relatively high CTE value (e.g., a CTE value of $15.5*10^{-6}$/°C. for a substantially copper insert 101). It is noted that the scope of the present invention is not limited in this respect, and embodiments of the invention may use various other suitable metals, alloys and/or materials, as well as various other percentage values.

Ring or surrounding body 102 may be formed of, or may include, for example, a relatively stiff material which may have a low or a relatively low CTE value, or a low or a relatively low thermal expansion coefficient. In some embodiments, ring or surrounding body 102 may be formed, for example, substantially of tungsten (for example, an alloy or body which may have between 30 percent and 100 percent tungsten, and which may have a CTE value of, for example, $4.5*10^{-6}/°C.$). In some embodiments, ring or surrounding body 102 may be formed, for example, substantially of stainless steel (for example, an alloy or body which may have between 30 percent and 100 percent stainless steel, and which may have a CTE value of, for example, 10*10−6/°C.). In some embodiments, ring or surrounding body 102 may be formed, for example, substantially of a suitable nickel iron (Ni—Fe) alloy (for example, an alloy or body which may have between 30 percent and 100 percent nickel iron alloy, such as invar, which may have a CTE value of, for example, $1.3*10^{-6}/°C.$). In some embodiments, ring or surrounding body 102 may be formed, for example, substantially of carbon fibers (for example, an alloy or body which may have between 10 percent and 100 percent carbon fibers, which may have a CTE value of, for example, $0*10^{-6}°C.$). It is noted that the scope of the present invention is not limited in this respect, and embodiments of the invention may use various other suitable metals, alloys and/or materials, as well as various other percentage values and/or CTE values.

In some embodiments, ring or surrounding body 102 may be formed of, or may include, for example, a material which may have a high or a relatively high elastic modulus. In some embodiments, ring or surrounding body 102 may be formed, for example, substantially of tungsten (for example, an alloy or body which may have between 30 percent and 100 percent tungsten, which may have an elastic modulus value of, for example, 411 GigaPascal). In some embodiments, ring or surrounding body 102 may be formed, for example, substantially of stainless steel (for example, an alloy or body which may have between 30 percent and 100 percent stainless steel, which may have an elastic modulus value of, for example, 240 GigaPascal). In some embodiments, ring or surrounding body 102 may be formed, for example, substantially of a suitable nickel iron (Ni—Fe) alloy (for example, an alloy or body which may have between 30 percent and 100 percent nickel iron alloy, such as invar, which may have an elastic modulus value of, for example, 148 GigaPascal). In some embodiments, ring or surrounding body 102 may be formed, for example, substantially of carbon fibers (for example, an alloy or body which may have between 10 percent and 100 percent carbon fibers, which may have an elastic modulus value of 500 GigaPascal). It is noted that the scope of the present invention is not limited in this respect, and embodiments of the invention may use various other suitable metals, alloys and/or materials, as well as various other percentage values or values of elastic modulus.

In the example shown in FIG. 1A, IHS 100, insert 101 and/or ring or surrounding body 102 may have a square shape. However, the present invention is not limited in this respect; in various embodiments of the invention, IHS 100, insert 101 and/or ring or surrounding body 102 may have, for example, rectangular shape, round shape, triangular shapes, trapezoid shape, parallelogram shape, rhombus shape, diamond shape, oval shape, elliptic shape, polygon shape, or various other suitable shapes.

Similarly, the relative proportions, dimensions or sizes of insert 101 and/or ring or surrounding body 102 are not limited to the example shown in FIG. 1A. For example, in some embodiments, ring or surrounding body 102 may be relatively larger or relatively smaller than insert 101, or vice versa. In some embodiments, ring or surrounding body 102 may occupy, for example, 10 percent, 25 percent, 50 percent, or 90 percent of the entire size of IHS 100; other suitable percentage values may be used in accordance with embodiments of the invention. In some embodiments, the dimensions of IHS 100 may include, for example, a length of 30 millimeters, a width of 30 millimeters, and a height of 3 millimeters; other dimensions, sizes and/or proportions may be used in accordance with embodiments of the invention.

In one embodiment, ring or surrounding body 102 may, for example, generally surround the long dimensions of insert 101. Ring or surrounding body 102 may, for example, not be in contact and/or not surround all of, substantially all of, most of, or a portion of, the flat or long sides of insert 101. Ring or surrounding body 102, for example, may leave a first flat side of insert 101 to contact an adjacent layer or component, for example, a TIM layer, and/or may leave a second flat side of insert 101 to be exposed (e.g., in touch with air, gas, or vacuum) or in touch with another body, structure, layer or component.

It should be appreciated that in accordance with some embodiments of the invention, and since a portion of IHS 100 (e.g., ring or surrounding body 102) may be formed of a material with a relatively low CTE value, the total CTE value or the average CTE value of IHS 100 may be lower than a similar IHS formed wholly or substantially of copper, silver, aluminum, or another material from which insert 101 may be formed.

In some embodiments, for example, by using a relatively low CTE-value ring or surrounding body 102 together with insert 101, the overall or average CTE value of IHS 100 may be reduced or significantly reduced. This may be achieved, for example, while keeping a high-conductivity material (e.g., insert 101) inside IHS 100, thus allowing heat spreading, heat absorption and/or heat transfer by the high-conductivity material. For example, in one embodiment, the overall or average CTE value of IHS 100 may be $6*10^{-6}/°C.$; various other overall or average CTE values may be possible.

It is noted that in some embodiments, insert 101 may be located and/or positioned substantially at or near the geometric center of IHS 100; such location and/or positioning may allow improved performance of IHS 100, for example, if the majority or a significant portion of the heat transfer may occur in that area. However, the present invention is not limited in this regard; for example, embodiments of the invention may include an IHS 100 with a non-central insert 101, or with more than one insert 101. Furthermore, embodiments of the invention may include, for example, an IHS 100 formed of a suitable composition of various portions or parts formed of a high-conductivity material and other portions or parts formed of a low-CTE material. Embodiments of the invention may further include, for example, an IHS 100 in which a portion of a high-CTE material is substituted or replaced with a relatively low-CTE material.

It should be appreciated that in accordance with various embodiments of the invention, an IHS (e.g., IHS 100) may include a first component (e.g., insert 101) formed of a high thermal conductivity material with a first coefficient of thermal expansion, and a second component (e.g., ring or surrounding body 102) formed of a stiff material with a second coefficient of thermal expansion, wherein the second coefficient of thermal expansion is smaller, or significantly smaller, than the first coefficient of thermal expansion. It is noted that the present invention is not limited in this respect, and that embodiments of the invention may include, for example, various other combinations of components, parts, portions and/or materials, which may have various relatively high and/or relatively low CTE values.

Figure 1B:
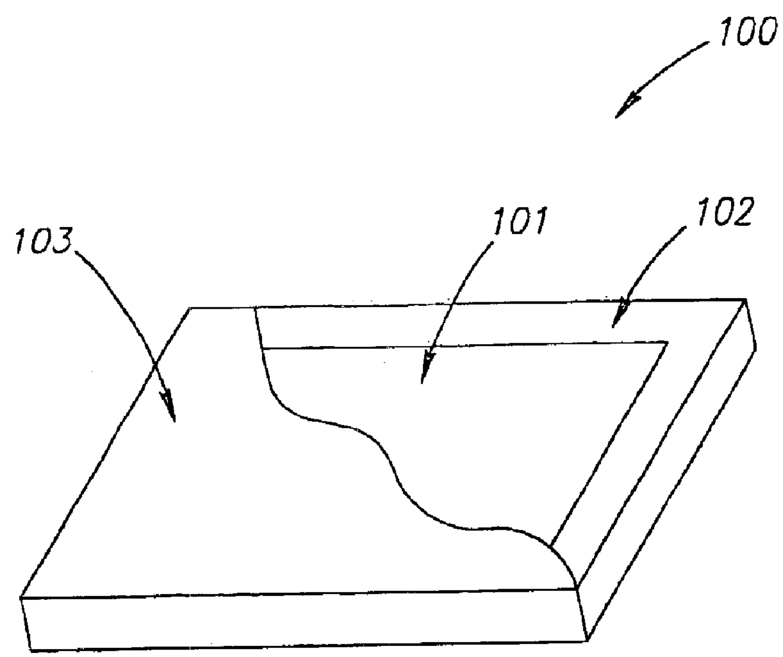
FIG. 1B is a schematic illustration of a top view of a plated IHS in accordance with an embodiment of the invention.
Figure 2A:
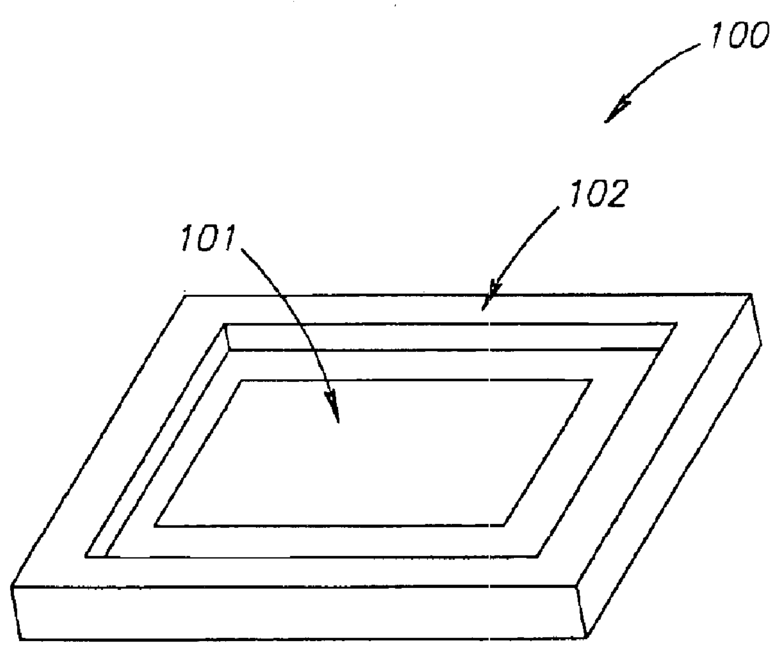
FIG. 2A is a schematic illustration of a bottom view of an IHS in accordance with an embodiment of the invention.
Figure 3:
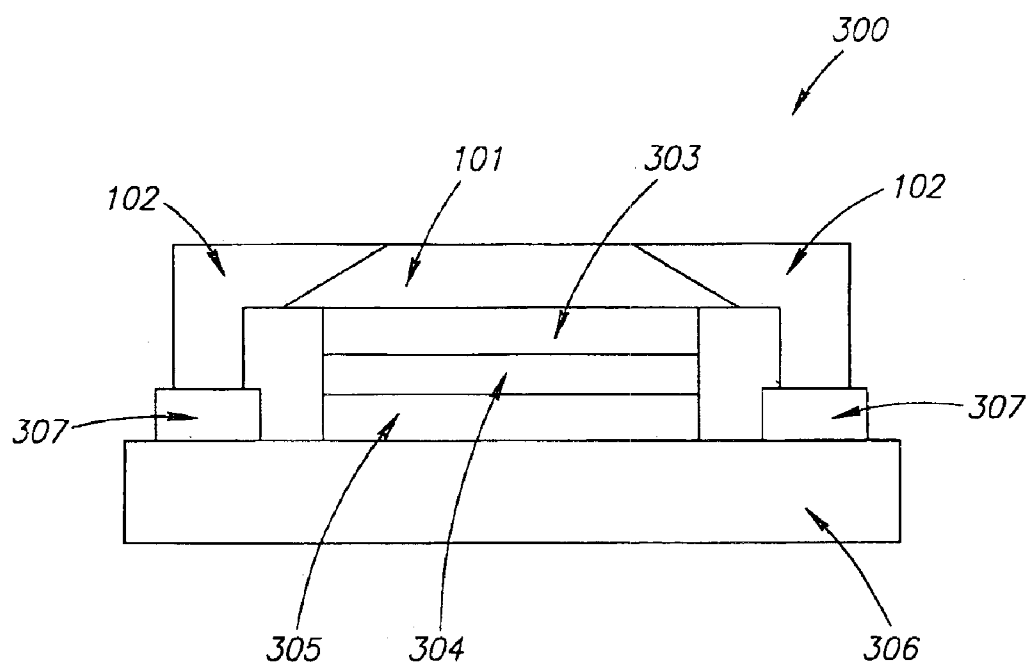
FIG. 3 is a schematic illustration of a device incorporating an IHS in accordance with an embodiment of the invention.

The IHSs shown in FIGS. 1A, 2A, 3 and/or 4 may be, for example, plated or coated. FIG. 1B is schematic illustration of a top view of a plated IHS in accordance with an embodiment of the invention. IHS 100 may include, for example, insert 101, ring or surrounding body 102, and a plating 103. In FIG. 1B, plating 103 is shown partially cut away, to reveal other components. Other suitable components may be included in IHS 100.

In some embodiments, plating 103 may include, for example, one or more suitable plates, platings, coatings, covers, layers and/or lids. In some embodiments, plating 103 may be formed of, or may include, for example, a plating or platings that may be compatible with a suitable PTIM or a suitable STIM. In one embodiment, for example, plating 103 may include a lid which may be formed of copper or substantially copper. In one embodiment, for example, plating 103 may be a coating or plating of nickel or substantially nickel. In some embodiments, for example, plating 103 may be plated with 4 micrometers of nickel on some or all surfaces of plating 103. Other suitable plating materials may be used, and other dimensions and thickness values are possible.

Figure 2B:
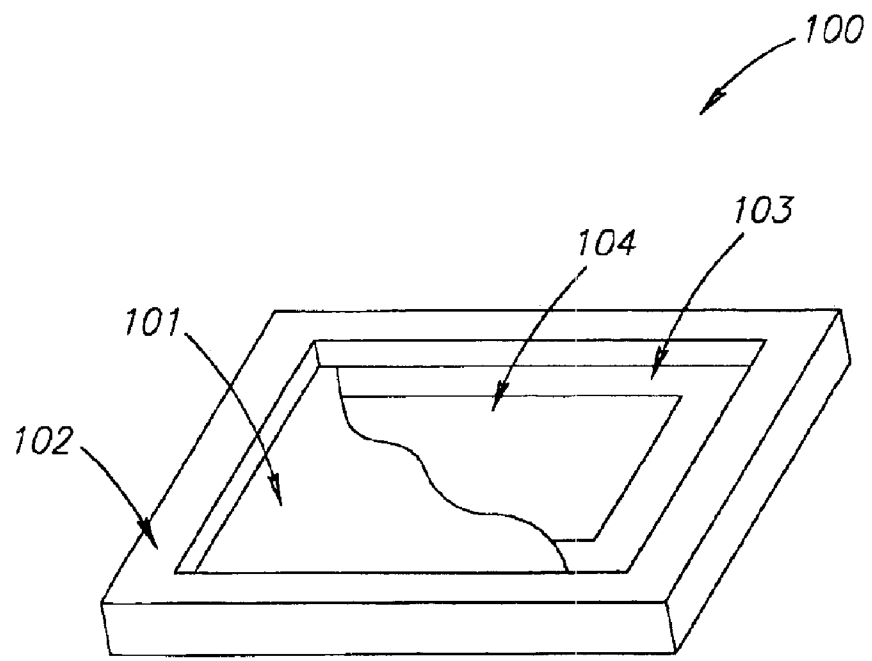
FIG. 2B is a schematic illustration of a bottom view of a plated IHS in accordance with an embodiment of the invention.

In alternate embodiments, plating 103 may include, for example, a plating or platings that may be compatible with a suitable STIM which may be plated with nickel or other suitable material, and which may also include a thin (e.g., 0.2 micrometer) patch 104 (which is shown in FIG. 2B in a bottom view of IHS 100). Patch 104 may be formed, for example, of gold or substantially gold, or other suitable material. Patch 104 may, for example, cover some or all of insert 101 (e.g., the bottom side of IHS 100), may extend beyond insert 101 and/or beyond one or more edges or sides of insert 101, and/or may improve solderability of IHS 100. Other suitable plating and/or patching materials may be used, and other dimensions and thickness values are possible.

FIG. 2A is a schematic illustration of a bottom view of an IHS in accordance with an embodiment of the invention. In one embodiment, IHS 100 may be shaped and formed, for example, as illustrated schematically in FIG. 2A; other shapes and forms may be used in accordance with embodiments of the invention. For example, in IHS 100, four sides of insert 101 may be in contact with, and/or surrounded by, ring or surrounding body 102, and two sides of insert 101 (e.g., two opposite flat sides of insert 101, which may have a surface area relatively bigger than other sides of insert 101) may be not in contact with ring or surrounding body 102.

In one embodiment, insert 101 may, for example, be taper-shaped or wedge-shaped. Insert 101 may include one or more panels that may be gradually narrowing, may include one or more diagonal side surfaces, or may have a gradual decrease of thickness. Other suitable shapes and forms may be used.

Similarly, in some embodiments, ring or surrounding body 102 may be shaped and/or formed to fit around insert 101. For example, in one embodiment in which insert 101 may include diagonal side surfaces, ring or surrounding body 102 may also include diagonal side surfaces to allow ring or surrounding body 102 to fit around 102 and to avoid a space between ring or surrounding body 102 and ring or surrounding body 102. In some embodiments, insert 101 and/or ring 102 may be shaped and/or contoured, and/or may include interlocking features and/or portions, for example, to allow interlocking of insert 101 within ring 102, to keep ring 101 from falling out of ring 102 or from moving within ring 102, or to improve stability of IHS 100.

It should be appreciated that in some embodiments, a taper-shape of wedge-shape of insert 101 may have various functional benefits. For example, these shapes or other suitable shapes of insert 101 may allow, for example, keeping a TIM layer in compression, when a TIM material is placed in proximity to IHS 100 (e.g., under or above IHS 100, or under or above insert 101).

FIG. 2B is schematic illustration of a bottom view of a plated IHS in accordance with an embodiment of the invention. IHS 100 may include, for example, insert 101, ring or surrounding body 102, plating 103, and optionally patch 104. In FIG. 2B, plating 103 is shown partially, cut away, to reveal other components. Plating 103 and/or patch 104 may have properties and/or functionalities as detailed above. Other suitable components may be included in IHS 100.

It is noted that although FIGS. 1A, 1B, 2A and 2B schematically illustrate various top views and bottom views of non-plated and plated IHS 100, the present invention is not limited in this respect. In some embodiments, for example, IHS 100 may be plated, non-plated, partially plated, patched, or non-patched. In some embodiments, for example, IHS 100 may be rotated, positioned, flipped, aligned and/or located in various other positions and angles, horizontally, vertically and/or diagonally. For example, IHS 100 may be turned or positioned upside down, or placed or used in a suitable angle in relation to another component. In some embodiments, IHS 100 may be static and non-moving, or it may be used, for example, for packaging of a device (e.g., a processor, a controller, or a memory unit) which may be used in a portable device (e.g., a laptop computer).

FIG. 3 is a schematic illustration of a device incorporating an IHS in accordance with an embodiment of the invention. Device 300 may be, for example, a semiconductor device, a processor, a “chip”, a memory unit, a controller, or other suitable device.

Device 300 may include, for example, insert 101, ring or surrounding body 102, TIM 303, die 304, underfill 305, substrate 306, and sealant 307. Device 300 may include other suitable components and/or layers, e.g. a coating or a plating which may be (but need not be) similar to plating 103 of FIG. 1B and/or FIG. 2B. The components of device 300 may be placed and/or positioned, for example, as illustrated schematically in FIG. 3; however, the present invention is not limited in this respect, and various other arrangements, placements and/or positioning, of these and/or other suitable components, may be used in accordance with embodiments of the invention.

Die 304 may include, for example, a silicon die or a semiconductor die, which may include one or more electronic circuits, transistors, resistors, capacitors, or other suitable electric components and/or electronic components. Die 304 may further include, for example, contacts, connectors, electrical connections, sockets, pins, pads, and/or bumps, which may carry electrical signals into and out of die 304. Die 304 may perform all or part of various functions and may act as various units, such as, for example, storing data, processing data, acting as a controller, a processor, a Central Processing Unit, (CPU), a Digital Signal Processor (DSP), an analog signal processor, a circuit, a circuitry, a flash memory, a Random Access Memory (RAM), a Dynamic RAM (DRAM), a wireless communication circuitry, an oscillator, an amplifier, a timer, a counter, etc., or other functions.

In some embodiments, TIM 303 may include a STIM material, for example, indium or other suitable materials. In alternate embodiments, Tim 303 may include a PTIM material, for example, a polymer with a high or a relatively high elongation-to-failure value. TIM 303 may bond insert 101 to die 304. In some embodiments, TIM 303 may include a material (e.g., indium) which may have a low or a relatively low elastic modulus and/or high ductility; this may allow TIM 303, for example, to absorb pressure, load and/or stress.

Underfill 305 may include, for example, a suitable fill substance or polymer material. In one embodiment, underfill 305 may include, for example, a No-flow Underfill (NUF), epoxy, or other suitable filling materials. Underfill 305 may, for example, control and/or absorb stress in device 300, provide support to device 300, and/or connect die 304 and substrate 306.

Sealant 307 may include, for example, a suitable polymer material. In one embodiment, sealant 307 may include, for example, silicone rubber or a suitable adhesive material or bonding material. In one embodiment, for example, sealant 307 may be bonded to ring 102 and to substrate 306. Sealant 307 may, for example, bond and/or hold together components and/or packaging components of device 300.

Substrate 306 may be formed, for example, of suitable ceramic materials and/or organic materials; other suitable materials may be used. Substrate 306 may, for example, provide support and structural strength to device 300, and/or provide protection to die 304 or other components of device 300. Furthermore, substrate 306 may provide external electrical connections for die 304; for example, substrate 306 may include electrical connections to allow connecting die 304 to another device or component (e.g., to a motherboard).

It is noted that the schematic illustration of FIG. 3 shows the state of device 300 in room temperature, for example, when electric power is not supplied to device 300, or after the manufacturing process of device 300 ended.

Figure 4:
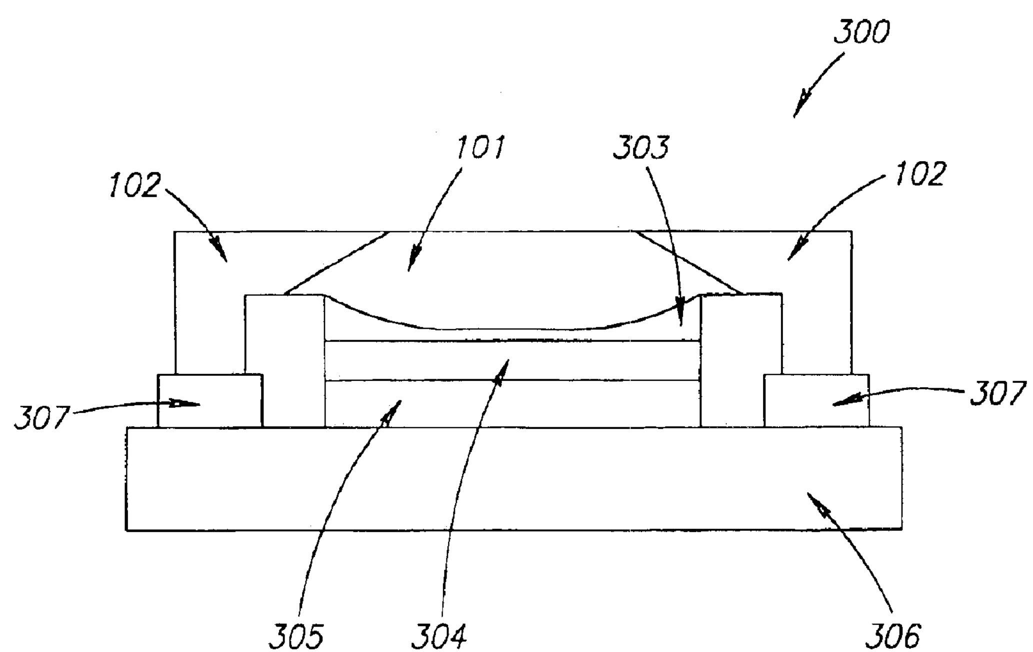
FIG. 4 is a schematic illustration of the device of FIG. 3 when at an elevated temperature, in accordance with an embodiment of the invention.

FIG. 4 is a schematic illustration of device 300 when at an elevated temperature, in accordance with an embodiment of the invention. The elevated temperature may be produced, for example, by providing electric power to device 300 and/or to die 104, by placing device 300 in proximity to a hot device or a relatively hot device, by placing device 300 in proximity to a heat-emitting device or to a device which may emit warm air or hot air (e.g., a cooling fan inside a computer). In some embodiments, the elevated temperature may be produced, for example, by placing device 300 inside an "oven" (e.g., during a "baking" operation which may be a part of the manufacturing process of device 300), or by placing device 300 inside an environment which has an elevated temperature (e.g., inside a hot room or within a hot climate). Other devices, processes and/or conditions may cause elevation of the temperature of device 300.

In some embodiments, heat may be absorbed by insert 101. For example, in some embodiments, electric power may be provided to die 304, causing insert 101 to absorb heat. In some embodiments, insert 101 may expand, may bend, or may form a curvature as illustrated schematically in FIG. 4. Such expansion, bending or curvature may, for example, compress, load, stress and/or press TIM 303, or may cause TIM 303 to be in a state of compression. In some embodiments, the taper-shape or the wedge-shape of insert 101 may further enhance the compression on TIM 303.

In some embodiments, a compressive load on TIM 303 may be beneficial. For example, the compression may suppress, eliminate and/or mitigate crack formation in TIM 303, and/or may otherwise increase the reliability of device 300.

It is noted that the curves in the shapes of insert 101 and/or TIM 303 are intentionally exaggerated, for purposes of illustration clarity. The present invention is not limited in this respect, and in various embodiments these curves may be, for example, not visible at all, smaller, bigger, differently shaped, differently curves and/or differently positioned. In some embodiments, curves may not result at all, or shapes other than curves may result.

It should be appreciated that for purposes of simplicity, a portion of the discussion herein relates mainly to a bi-metallic IHS 100. However, the scope of the present invention is not limited in this respect, and various embodiments of the invention may include, for example, a bi-material IHS, a triple-metallic IHS, a triple-material IHS, a quadruple-metallic IHS, a quadruple-material IHS, or other suitable multi-metallic IHSs or multi-material IHSs. In some embodiments, for example, one or more materials (e.g., suitable metals or alloys) may be used to form an IHS which may have a relatively lower CTE value than a corresponding CTE value of a similar single-metal IHS or a single-material IHS.

In accordance with some embodiments, an IHS may include, for example, a first portion including substantially a first material, and a second portion including substantially a second material, wherein the first material is a metal, and wherein the volume of the first portion is smaller than a pre-defined percent of the volume of the IHS. The pre-defined percentage value may be, for example, 90 percent, 85 percent, 75 percent, 70 percent, 51 percent, 50 percent, 25 percent, 15 percent, or other suitable percentage values.

Various embodiments of the invention may allow various benefits. For example, in one embodiment, an overall or average CTE value of an IHS may be reduced or dramatically reduced (e.g., in comparison to a similar single-metal IHS), while keeping a high-conductivity material (e.g., insert 101) within the IHS. Furthermore, a beneficial load, compression, stress and/or pressure may be provided, for example, by insert 101 and/or IHS 100 to TIM 304. In some embodiments, such compression may mitigate, reduce, minimize and/or eliminate dielectric film cracking on die 304. The compression may mitigate, minimize and/or eliminate cracking of TIM 304, for example, in some embodiments in which TIM 304 includes STIM; this in turn may allow using a wider variety of materials to form TIM 304. Similarly, the compression may mitigate, reduce, minimize and/or eliminate delamination of TIM 304, for example, in some embodiments in which TIM 304 includes PTIM. In some embodiments, stress on die 304 may be mitigated, reduced, minimized or eliminated.

In some embodiments, TIM 304 may be thinner or significantly thinner than a similar TIM layer of a conventional IHS. A conventional TIM layer may be kept thick or relatively thick, for example, to absorb strains and pressures caused by CTE differences. In accordance with some embodiments of the invention, Tim 304 may be thinner, for example, since CTE differences may be smaller or significantly smaller as a result of using an IHS 100. In some embodiments, using a relatively thin TIM 304 may in turn allow device 304 to be thinner and/or smaller.

In some embodiments, using a relatively thin TIM 304 may, for example, enhance the thermal conductivity of device 300, or may decrease the thermal resistance (e.g., the thermal Resistance of Junction to Case (Rjc) value) of device 300. This may allow, for example, higher reliability of device 300, higher resistance to thermal cycles and/or to enabled load, and/or longer life or performance life of device 300. Furthermore, this may in some cases allow device 300 to operate, or to more reliably operate, at a higher frequency or at a higher clock speed.

In some embodiments, it may be less expensive to produce IHS 100 in comparison to a similar single-metal IHS or single-material IHS. This may be allowed, for example, in some embodiments in which the cost of the material used to form ring or surrounding body 102 is lower than the cost of the material used to form insert 101.

It is noted that various other benefits, in addition to or instead of the benefits discussed, may be achieved by using a bi-metallic or a multi-metallic IHS, or by using a package or a device which incorporates a bi-metallic or a multi-metallic IHS.

Figure 5:
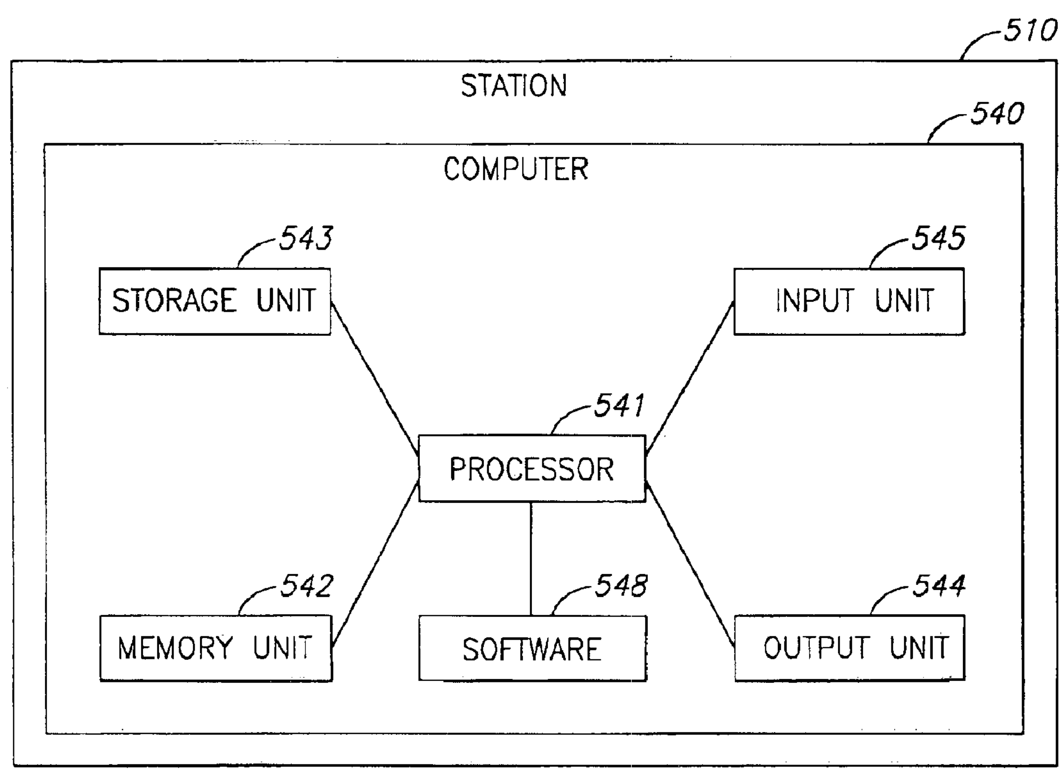
FIG. 5 is a schematic illustration of a station in accordance with an embodiment of the invention.

FIG. 5 schematically illustrates a station in accordance with an embodiment of the invention. Station 510 may include, for example, various components which may incorporate or may be an IHS (e.g., IHS 100) and/or a device (e.g., device 300) in accordance with embodiments of the invention. Station 510 may be, for example, a computing platform or a computing device. For example, station 510 may include a personal computer, a desktop computer, a mobile computer, a laptop computer, a notebook computer, a terminal, a workstation, a server computer, a Personal Digital Assistant (PDA) device, a tablet computer, a specialized or dedicated computing device, a network device, a telecommunication device, a wireless communication device, or the like. Station 510 may be implemented using any suitable combination of hardware components and/or software components.

In the example shown in FIG. 5, station 510 may include a computer 540, which may include, for example, one or more processors 541, one or more memory units 542, one or more storage units 543, an output unit 544, an input unit 545, and software 548. Station 510 may include other suitable components or sets of components.

Processor 541 may include, for example, a CPU, a DSP, one or more controllers, or any suitable specific and/or general and/or multi-purpose processor or micro-processor or controller. Processor 541 may include, for example, one or more IHS components in accordance with embodiments of the invention (e.g., one or more IHS 100 units). Processor 541 may include or may be, for example, one or more devices or semiconductor devices in accordance with embodiments of the invention (e.g., one or more device 300 units).

Memory unit 542 may include, for example, a Random Access Memory (RAM), a Read Only Memory (ROM), a Dynamic RAM (DRAM), or other suitable memory units. Memory unit 542 may include, for example, one or more IHS components in accordance with embodiments of the invention (e.g., one or more IHS 100 units). Memory unit 542 may include or may be, for example, one or more devices or semiconductor devices in accordance with embodiments of the invention (e.g., one or more device 300 units).

Storage unit 543 may include, for example, a hard disk drive, a floppy disk drive, a Compact Disk (CD) drive, a CD-ROM drive, or other suitable removable or non-removable storage units or memory modules. Output unit 544 may include, for example, a monitor or a printer. Input unit 545 may include, for example, a keyboard, a mouse, a touch-pad, or a scanner.

It is noted that processor 541, memory 542, storage unit 543, output unit 544 and/or input unit 545 may include other suitable components and/or implementations as is known in the art.

Software 548 may include, for example, one or more operating systems (e.g., Microsoft Windows, Linux, Unix, Apple OS, Solaris, Sun-OS, HP-UX, or other suitable operating systems), one or more software applications, one or more drivers, and/or various other suitable software components.

It is noted that station 510 and/or computer 540 may include various other components, and/or may be configured with additional and/or alternative units. Further, station 510 and/or computer 540 may be implemented using any suitable combination of hardware and/or software, and may include any circuit, circuitry, controller, gate, buffer, unit or combination of integrated and/or separate units or circuits, as are known in the art, to perform desired functionalities.

While certain features of the invention have been illustrated and described herein, many modifications, substitutions, changes, and/or equivalents may occur to those skilled in the art. It is, therefore, to be understood that the appended claims are intended to cover all such modifications and/or changes.

What is claimed is:

1. An integral heat spreader comprising:

an insert formed of a high thermal conductivity material with a first coefficient of thermal expansion; and a ring formed of a material with a second coefficient of thermal expansion, wherein the second coefficient of thermal expansion is smaller than the first coefficient of thermal expansion, and wherein the insert is substantially taper-shaped.

2. The integral heat spreader of claim 1, wherein the high thermal conductivity material comprises copper.

3. The integral heat spreader of claim 1, wherein the high thermal conductivity material comprises aluminum.

4. The integral heat spreader of claim 1, wherein at least 30 percent of the high thermal conductivity material comprises copper.

5. The integral heat spreader of claim 1, wherein the material comprises tungsten.

6. The integral heat spreader of claim 1, wherein the material comprises stainless steel.

7. The integral heat spreader of claim 1, wherein the material comprises invar.

8. The integral heat spreader of claim 1, wherein the material comprises carbon fiber.

9. The integral heat spreader of claim 1, wherein the material comprises a nickel iron alloy.

10. The integral heat spreader of claim 1, wherein the material comprises a material with high elastic modulus.

11. The integral heat spreader of claim 1, wherein the ring includes a stiff material.

12. The integral heat spreader of claim 1, wherein the insert is substantially taper-shaped.

13. The integral heat spreader of claim 1, wherein the volume of the ring is smaller than 25 percent of the volume of the integral heat spreader.

14. The integral heat spreader of claim 1, wherein the volume of the ring is smaller than 50 percent of the volume of the integral heat spreader.

15. The integral heat spreader of claim 1, wherein the volume of the ring is smaller than 85 percent of the volume of the integral heat spreader.

16. The integral heat spreader of claim 1, comprising a plating.

17. A semiconductor device comprising:

a silicon die; and an integral heat spreader comprising:

an insert formed of a high thermal conductivity material with a first coefficient of thermal expansion; and a ring formed of a material with a second coefficient of thermal expansion, wherein the second coefficient of thermal expansion is smaller than the first coefficient of thermal expansion, and wherein the insert is substantially taper-shaped.

18. The semiconductor device of claim 17, comprising a thermal interface material.

19. The semiconductor device of claim 18, comprising an underfill.

20. The semiconductor device of claim 19, comprising a substrate.

21. The semiconductor device of claim 20, comprising a sealant.

22. The semiconductor device of claim 21, wherein the semiconductor device comprises a processor.

23. The semiconductor device of claim 17, wherein the ring includes a stiff material.

24. A device comprising:

a dynamic random access memory; and a semiconductor device comprising:

a silicon die; and an integral heat spreader comprising:

an insert formed of a high thermal conductivity material with a first coefficient of thermal expansion; and a ring formed of a material with a second coefficient of thermal expansion, wherein the second coefficient of thermal expansion is smaller than the first coefficient of thermal expansion, and wherein the insert is substantially taper-shaped.

25. The device of claim 24 wherein the semiconductor device comprises a thermal interface material.

26. The device of claim 24, wherein the semiconductor device comprises a substrate.

27. The device of claim 24, wherein the ring includes a stiff material.

28. The integral heat spreader of claim 1, wherein said insert is wedge-shaped.

29. The integral heat spreader of claim 1, wherein the taper shape of said insert is such that said insert is able to expand as temperature rises.

30. The integral heat spreader of claim 1, wherein the taper shape of said insert is such that said insert is able to bend as temperature rises.

31. The integral heat spreader of claim 1, wherein the taper shape of said insert is such that said insert is able to curve as temperature rises.

32. The semiconductor device of claim 17, further comprising a Thermal Interface Material adjacent to said integral heat spreader, wherein said insert is able to compress said Thermal Interface Material as temperature rises.

* * * * *